(12) United States Patent
Yamada

(10) Patent No.: US 10,884,836 B2
(45) Date of Patent: Jan. 5, 2021

(54) ARITHMETIC PROCESSING DEVICE AND METHOD THEREFOR

(71) Applicants: Kabushiki Kaisha Toshiba, Minato-ku (JP); Toshiba Electronic Devices & Storage Corporation, Minato-ku (JP)

(72) Inventor: Yutaka Yamada, Fuchu (JP)

(73) Assignees: Kabushiki Kaisha Toshiba, Minato-ku (JP); Toshiba Electronic Devices & Storage Corporation, Minato-ku (JP)

(*) Notice: Subject to any disclaimer, the term of this patent is extended or adjusted under 35 U.S.C. 154(b) by 133 days.

(21) Appl. No.: 15/901,493

(22) Filed: Feb. 21, 2018

(65) Prior Publication Data

US 2019/0087260 A1   Mar. 21, 2019

(30) Foreign Application Priority Data

Sep. 21, 2017 (JP) .................. 2017-180772

(51) Int. Cl.
| | |
|---|---|
| G06F 11/07 | (2006.01) |
| G06F 11/14 | (2006.01) |
| G06F 11/22 | (2006.01) |
| G06F 11/27 | (2006.01) |
| G01R 31/317 | (2006.01) |
| G01R 31/3181 | (2006.01) |

(52) U.S. Cl.
CPC ...... *G06F 11/0721* (2013.01); *G01R 31/3181* (2013.01); *G01R 31/31724* (2013.01); *G06F 11/0751* (2013.01); *G06F 11/1469* (2013.01); *G06F 11/22* (2013.01); *G06F 11/2236* (2013.01); *G06F 11/2284* (2013.01); *G06F 11/27* (2013.01); *G06F 2201/84* (2013.01)

(58) Field of Classification Search
CPC ............. G06F 11/0721; G06F 11/0751; G06F 11/1469; G06F 2201/84
See application file for complete search history.

(56) References Cited

U.S. PATENT DOCUMENTS 3,963,201 A  *  6/1976  Brumberger ............ B61L 21/10
                                                      246/34 R
5,313,468 A       5/1994  Hoshi et al.
                         (Continued)

FOREIGN PATENT DOCUMENTS

| JP | 2009-111546 | 5/2009 |
|---|---|---|
| JP | 2013-165399 | 8/2013 |
| JP | 2017-45090 | 3/2017 |

*Primary Examiner* — Kamini B Patel
(74) *Attorney, Agent, or Firm* — Oblon, McClelland, Maier & Neustadt, L.L.P.

(57) ABSTRACT

An arithmetic processing device according to an embodiment performs actual arithmetic processing for data inputted periodically and determination whether or not an error occurs in the actual arithmetic processing in real time. An ISP of this device includes an arithmetic processing circuit for performing image arithmetic processing for image data in moving image inputted from imaging device at each of frames, and a diagnostics control circuit and diagnostics processing circuit connected to the arithmetic processing circuit. The ISP, with these components, performs the image arithmetic processing for the image data in the moving image at each of the frames and error detection in the image arithmetic processing in real time.

11 Claims, 10 Drawing Sheets

(56) References Cited

U.S. PATENT DOCUMENTS

| | | | | |
|---|---|---|---|---|
| 7,509,533 | B1* | 3/2009 | Govindarajalu | G06F 11/2242 |
| | | | | 714/30 |
| 8,799,713 | B2* | 8/2014 | Gangasani | G06F 11/27 |
| | | | | 714/30 |
| 2012/0124435 | A1* | 5/2012 | Eaton | G01R 31/31853 |
| | | | | 714/726 |
| 2016/0349322 | A1* | 12/2016 | Shibahara | G01R 31/3177 |
| 2018/0074927 | A1* | 3/2018 | Mori | G06F 11/27 |
| 2019/0026205 | A1* | 1/2019 | Jin | H03M 1/108 |
| 2019/0082172 | A1* | 3/2019 | Uetani | H04N 17/002 |

* cited by examiner

Backup Control Circuit 4

Diagnostics Processing Circuit 5

ARITHMETIC PROCESSING DEVICE AND METHOD THEREFOR

CROSS-REFERENCE TO RELATED APPLICATION

This application is based upon and claims the benefit of priority from Japanese Patent Application No. 2017-180772, filed on Sep. 21, 2017, the entire contents of which are incorporated herein by reference.

FIELD

Embodiments described herein relate generally to an arithmetic processing device performing real time diagnostics processing and method therefor.

BACKGROUND

A BIST (Built-In Self-Test) system is publicly known. The BIST system tests an LSI chip performing arithmetic processing by using circuits embedded within the LSI chip itself for generating test pattern, for testing feature and for verifying anticipated values of test outcomes. Further, a system having doubled arithmetic circuits is publicly known. In this system, an error of processing is detected with doubled arithmetic circuits within an LSI by inputting the same data into both of the same doubled arithmetic circuits and comparing two processing outcomes obtained from the doubled arithmetic circuits. According to the BIST system, it cannot be determined whether or not an error occurs within real time arithmetic processing. Further, the doubled arithmetic circuits described above increase circuit scale and chip size of the LSI.

DETAILED DESCRIPTION

An arithmetic processing device and method therefor according to this disclosure can determine whether or not an error occurs during real time arithmetic processing without incrementing circuit scale and chip size of an LSI by utilizing an internal circuitry of the LSI such as the BIST, for example. The arithmetic processing device according to an embodiment performs actual arithmetic processing for data inputted periodically and determination whether or not an error occurs in the actual arithmetic processing in real time. An ISP of this device includes an arithmetic processing circuit for performing image arithmetic processing for image data in moving image inputted from imaging device at each of frames. A diagnostics control circuit and a diagnostics processing circuit are connected to the arithmetic processing circuit. The ISP of the arithmetic processing circuit, with these components, performs the image arithmetic processing for the image data in the moving image at each of the frames and error detection in the image arithmetic processing in real time.

First Embodiment

The first embodiment will be described below in detail referring to drawings. The same reference numbers will be attached to the same components or processes in the embodiments.

[Configuration of an Image Processing Device 1]

Figure 1:
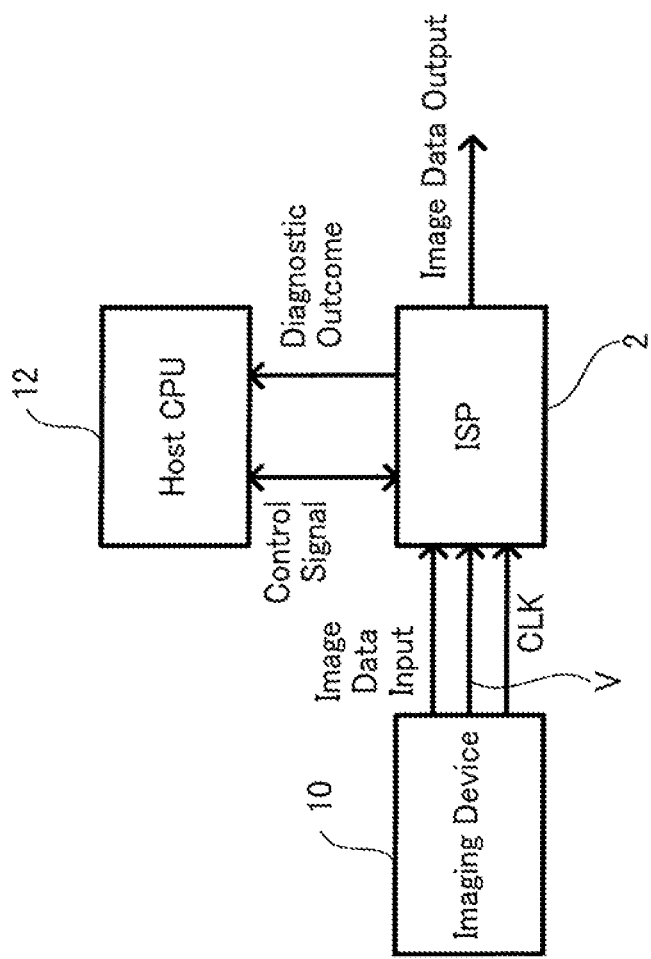
FIG. 1 is a configuration diagram of an image processing device according to an embodiment.

At first, the image processing device 1 according to an embodiment will be described below. FIG. 1 is a configuration diagram of an image processing device 1 according to an embodiment. The image processing device 1 comprises an imaging device 10 that captures an imaging target and generates image data of moving images (input data), an ISP (Image Signal Processor) 2 connected to the imaging device 10, and a host CPU connected to ISP 2. The image processing device 1 generates image data of moving images with these components. Further, image processing device 1 realizes image processing by arithmetic processing for automatic exposure control, auto focus control and for automatic white balance control for the generated image data. Note that, hereinafter, the image processing by the arithmetic processing will also be described as image arithmetic processing.

[Configuration of the ISP 2]

Figure 2:
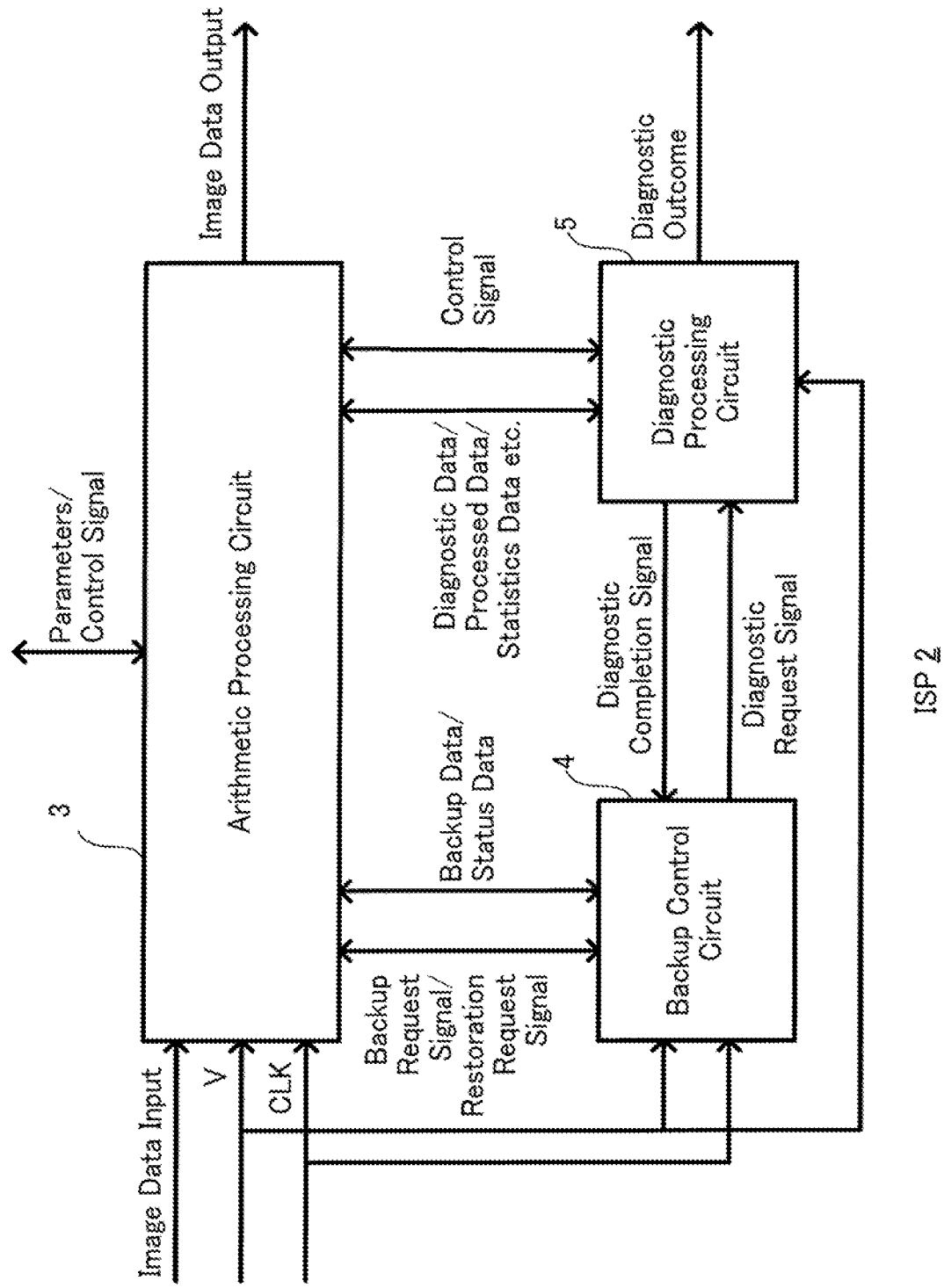
FIG. 2 is a configuration diagram of the ISP shown in FIG. 1.

FIG. 2 is a configuration diagram of the ISP 2 shown in FIG. 1. As shown in FIG. 2. The ISP 2 includes an arithmetic processing circuit 3 for performing image processing for the image data inputted from the imaging device 10, a diagnostics control circuit 4 and a diagnostics processing circuit 5 connected to the arithmetic processing circuit 3.

With these components, the ISP 2 performs image arithmetic processing at each of frames in the image data, and error detection of the image arithmetic processing using diagnostics data and outcome data indicating their expected values, parameters and status data for diagnostics, in real time. In FIG. 2, control signals collectively mean signals used for controls between the arithmetic processing circuit 3, the diagnostics control circuit 4, and the diagnostics processing circuit 5. Note that, the arithmetic processing circuit 3, the diagnostics control circuit 4 and the diagnostics processing circuit 5 are embedded within one LSI.

[Configuration of the Arithmetic Processing Circuit 3]

Figure 3:
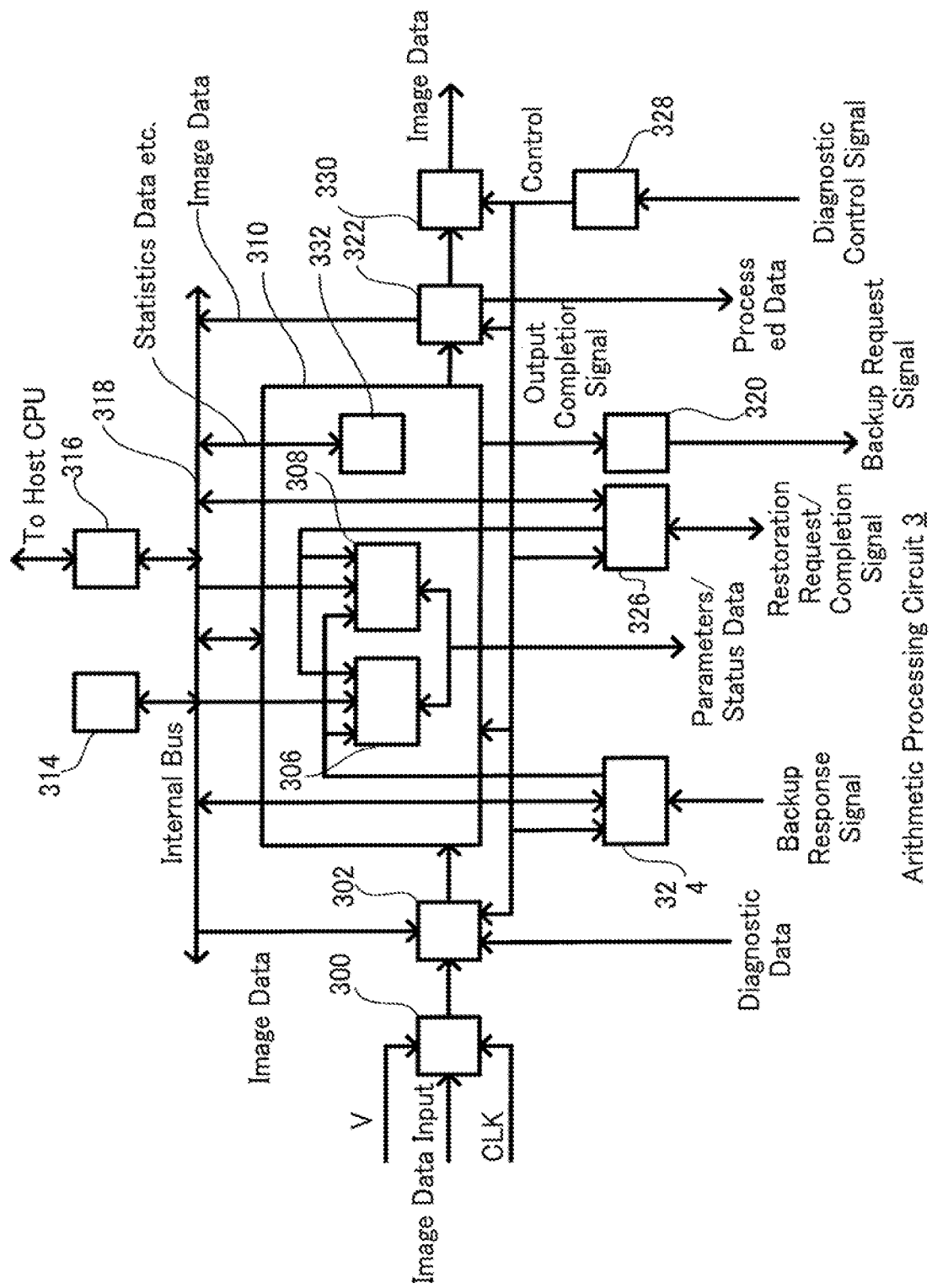
FIG. 3 is configuration diagram of the arithmetic processing circuit shown in FIG. 2.

FIG. 3 is configuration diagram of the arithmetic processing circuit shown in FIG. 2. As shown in FIG. 2, the arithmetic processing circuit 3 comprises an image device interface (IF) 300 that receives image data of the moving image inputted from the imaging device 10. Further, the arithmetic processing circuit 3 comprises a diagnostics data IF 302 connected to the image device IF 300.

Further, the arithmetic processing circuit 3 comprises an arithmetic circuit 310, a processed data output circuit 322, a backup response signal IF 324, a configuration/restoration control circuit 326, a diagnostics control signal IF 328 and an image data output circuit 330 connected to the diagnostics data IF 302. And the more, the arithmetic processing circuit comprises 3 comprises a first parameter memory 306, a first status register 308, a first status register 308 and a backup request circuit 320 connected to the arithmetic circuit 310.

Further, the arithmetic processing circuit 3 comprises a processing memory 314 and a host CPU-IF 316 connected to the arithmetic circuit 310 via an internal bus 318. Further, the arithmetic processing circuit 3 comprises a statistics information processing circuit 332 for generating statistics information such as histograms regarding the image processing to output them to the host CPU 12 via the internal bus 318 and the host CPU-IF 316. Note that, in practice, the parameter memory 306, the status register 308 and the statistics information processing circuit 332 are included in the arithmetic processing circuit 3. And note that, components for image processing of the arithmetic processing circuit 3 are omitted from FIG. 3. The arithmetic processing circuit 3 cooperates with the diagnostics control circuit 4 and the diagnostics processing circuit 5 to perform the image arithmetic processing and the diagnostics processing for making diagnostics so as to whether or not an error occurs within the image arithmetic processing.

[Configuration of the Diagnostics Control Circuit 4]

Figure 4:
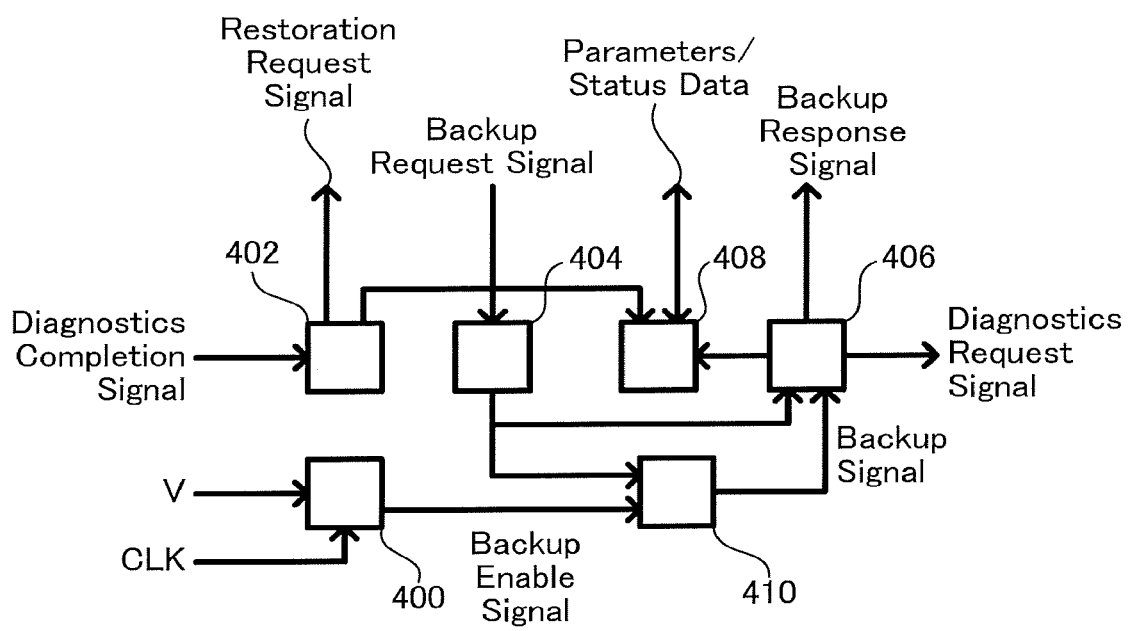
FIG. 4 is a configuration diagram of the backup control circuit shown in FIG. 2.

FIG. 4 is a configuration diagram of the backup control circuit shown in FIG. 2. As shown in FIG. 4, the diagnostics control circuit 4 comprises a timing control circuit 400 for controlling operation timing of the diagnostics control circuit 4, a backup response circuit 406 and a diagnostics request circuit 410 connected to it. Further, the diagnostics control circuit 4 comprises a restoration request circuit 402 for receiving restoration request signals from the arithmetic processing circuit 3, shown in FIG. 2 and FIG. 3, to perform restoration processing, and a backup/restoration memory 408 connected to it.

Further, the diagnostics control circuit 4 comprises a backup request signal IF 404 for receiving the backup request signal, and a diagnostics request circuit 410 connected to it. The diagnostics control circuit 4, with these components, controls the diagnostics processing performed by the diagnostics processing circuit 5 at each of the frames of the image data, and also performs processing for backup and restoration of the parameters and the status data for the image arithmetic processing by the arithmetic processing circuit 3.

[Configuration of the Diagnostics Processing Circuit 5]

Figure 5:
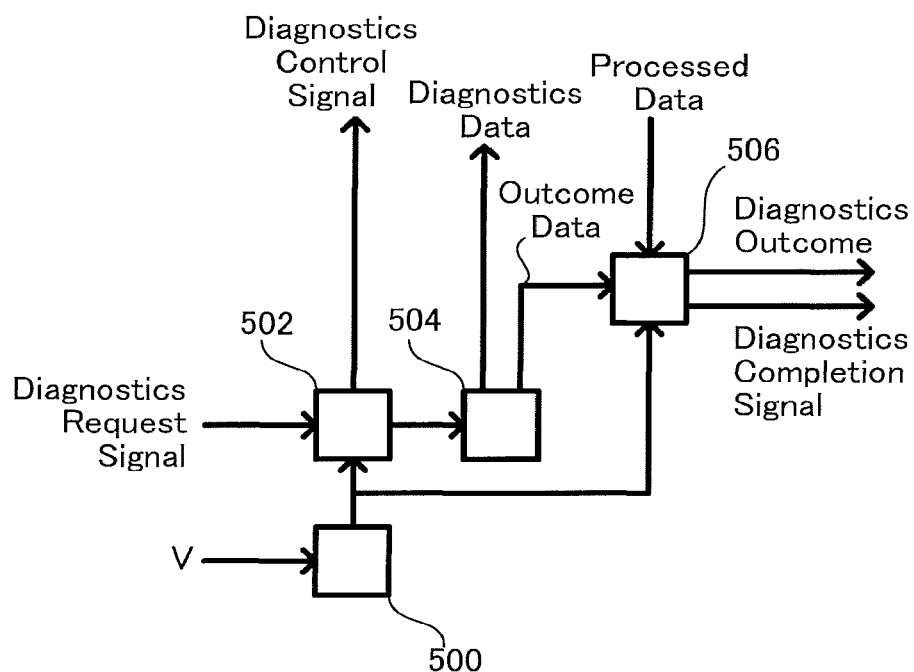
FIG. 5 is a configuration diagram of the diagnostics processing circuit shown in FIG. 2.

FIG. 5 is a configuration diagram of the diagnostics processing circuit 5 shown in FIG. 2. As shown in FIG. 5, the diagnostics processing circuit 5 comprises an operation control circuit 500 for controlling each of components of the diagnostics processing circuit 5, a control signal generation circuit 502 and a diagnostics circuit 506 connected to it. Further, the diagnostics processing circuit 5 comprises a diagnostics data memory 504 connected to the control signal generation circuit 502. Note that, when the ISP 2 includes an LBIST (Logic BIST), this LBIST can be used as the diagnostics processing circuit 5.

And note that, although the diagnostics processing circuit 5 may include a circuit for debugging the arithmetic processing circuit 3, the circuit for debugging is not shown in FIG. 5, when the LBIST is used as the diagnostics processing circuit 5. The diagnostics processing circuit 5, with these components, makes diagnostics so as to whether or not an error exists within the image arithmetic processing by the arithmetic processing circuit 3 at each of the frames of the image data.

[Components of the Image Processing Device 1]

Figure 6:
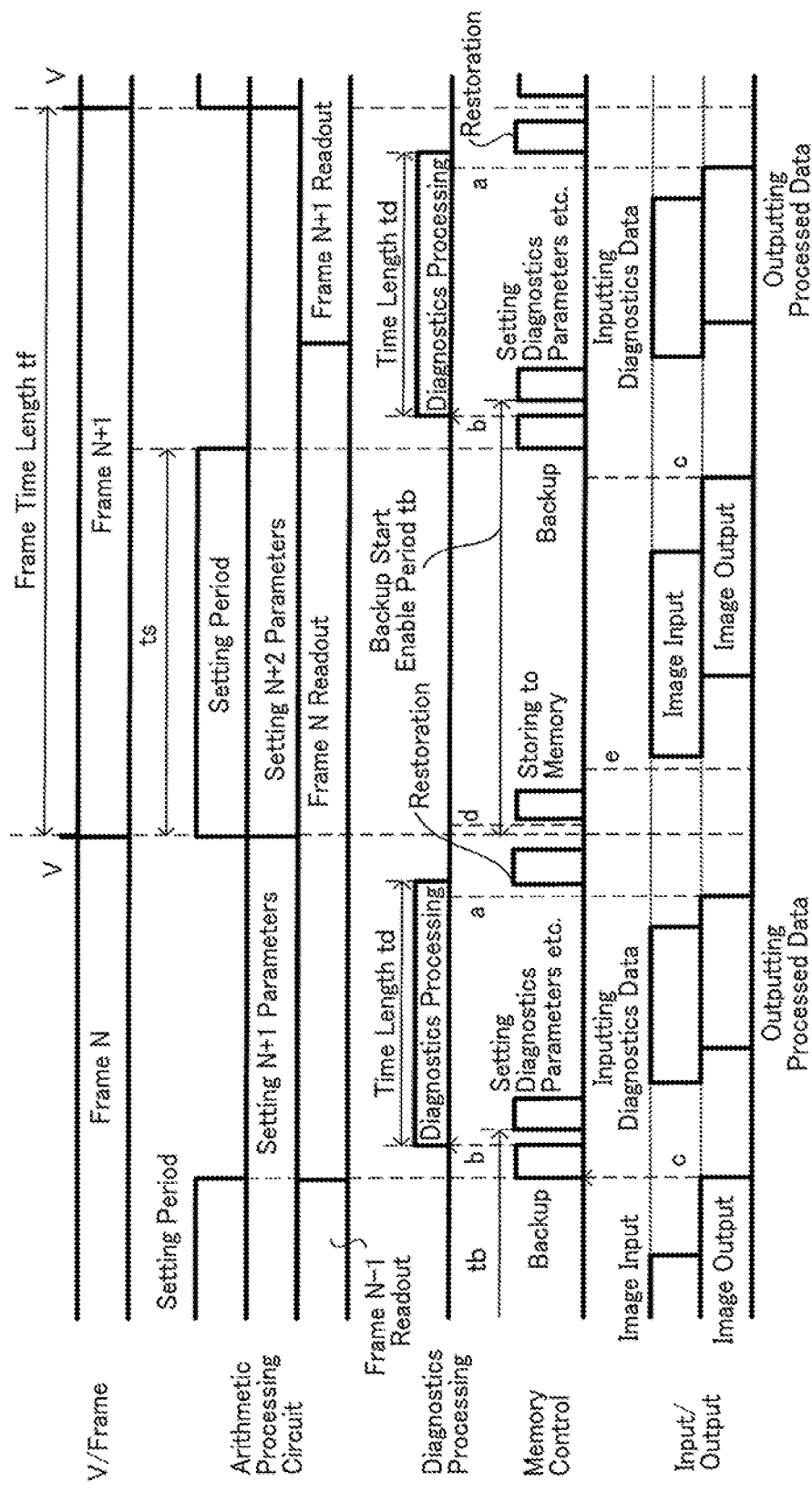
FIG. 6 is a timing chart at an arithmetic processing of the arithmetic processing circuit performed normally.
Figure 7:
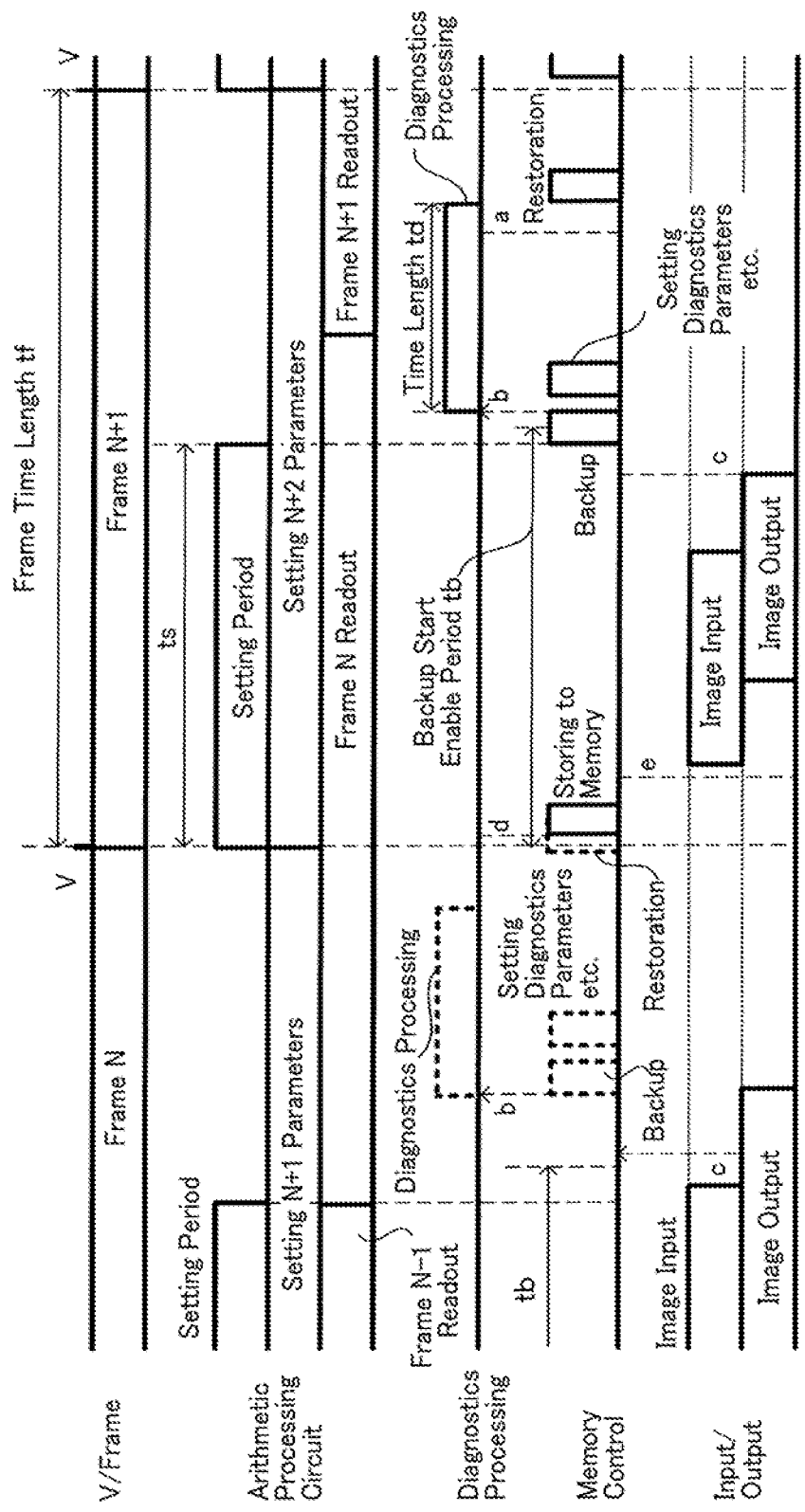
FIG. 7 is a timing chart at an occurrence of an error within an arithmetic processing of the arithmetic processing circuit.

Each of the components of the image processing device 1 will be described below, further referring to "V/Frame", "Arithmetic Processing Circuit", "Diagnostics Processing", "Memory Control" and "Input/Output" shown in FIG. 6, and those shown in FIG. 7. FIG. 6 is a timing chart at an arithmetic processing of the arithmetic processing circuit 3 performed normally. FIG. 7 is a timing chart at an occurrence of an error within an arithmetic processing of the arithmetic processing circuit 3. Note that, each of proportions of terms between "Diagnostics Processing" shown in FIG. 6 and FIG. 7, "Memory Control" shown in FIG. 6 and FIG. 7, and "Input/Output" shown in FIG. 6 and FIG. 7 is not necessarily same as those at the implementation.

And note that, frame cycles of synchronization signal V and timing of frame cycles of the image data inputted from the imaging device 10 to the arithmetic processing circuit 3 are shown as "V/Frame" in FIG. 6 and FIG. 7. Further, processing timing at the arithmetic circuit 310 are shown as "Arithmetic Processing Circuit" in FIG. 6, and as the same in FIG. 7. Terms during which contents of processing and their parameters may be set from the host CPU are shown on the top of "Arithmetic Processing Circuit" shown in FIG. 6, and of the same shown in FIG. 7. Terms during which the parameters and the status data used at the image arithmetic processing for data inputted in each of the frames may be stored are shown at the second top of "Arithmetic Processing Circuit" shown in FIG. 6 and FIG. 7. Terms during which processed data inputted to the arithmetic circuit 310 may be read at each of the frames are shown at the bottom of "Arithmetic Processing Circuit" shown in FIG. 6 and FIG. 7.

Further, terms during which the diagnostics processing may be performed are shown in "Diagnostics Processing" of FIG. 6 and FIG. 7. Further, terms during which backup and restorations stored in the parameter memory 306 and the status register 308 are performed are shown in "Memory Control" of FIG. 6 and FIG. 7. Further, timing for data input to the arithmetic circuit 310 and data output from the arithmetic circuit 310 are shown in "Input/Output" of FIG. 6 and FIG. 7.

[Imaging Device 10 and Host CPU 12]

Within the components of the image processing device 1 shown in FIG. 1, the imaging device 10 photographs objects to be shot and generates the image data of moving image at 40-60 frames every second. And the imaging device 10 sequentially outputs the generated image data to the ISP 2 at the timing shown in "V/Frame" of FIG. 6 and FIG. 7. Further, the imaging device 10 asserts the synchronization signal V showing boundaries of the frames at timing shown in "V/Frame" of FIG. 6, and in the same of FIG. 7. Further, the imaging device 10 outputs clock signal CLK that is synchronized with the image data to the ISP 2, Note that, even though not explicitly shown in the drawings, the synchronization signal V and the clock signal CLK are appropriately used for controlling operations of the components of the image processing device 1 described below.

The host CPU 12 sets the parameters, the status data and the other data used for selected image arithmetic processing to the ISP 2. Further, the host CPU 12 may set the configuration, parameters and the other data used for image arithmetic processing by the ISP 2 in each of the frame cycles (hereinafter, also described as frames). The host CPU 12 may set the configuration, parameters and the other data to the ISP 2 within frame N used during frame N+1 at timing shown on the second top of "Arithmetic Processing Circuit" shown in FIG. 6 and FIG. 7 (here, N is integer).

Note that, the arithmetic processing circuit 3 sequentially uses the same parameters and status data for image arithmetic processing, if those configuration, parameters and other data are not set. Further, the host CPU 12 inputs and outputs the control signals between the ISP 2 to control the operation of the ISP 2.

[Components of the Arithmetic Processing Circuit 3]

The host CPU-IF 316, shown in FIG. 2 and FIG. 3, sends and receives the control signals, the configuration of the image arithmetic processing, the parameters and the status data etc. between the host CPU 12 and the processing memory 314 shown in FIG. 1. The processing memory 314 is used as a work memory for the image arithmetic processing by the arithmetic circuit 310 to store data needed for the image arithmetic processing and its control.

The imaging device IF 300 receives the clock signal CLK and the synchronization signal V. Further, the imaging device IF 300 receives the image data synchronized with the clock signal CLK and the synchronization signal V to output it to the diagnostics data IF 302.

The diagnostics control signal IF 328 receives diagnostics control signal from the diagnostics control circuit 4 shown in FIG. 2 and FIG. 4. The diagnostics control signal IF 328 controls the diagnostics data IF 302, the arithmetic circuit 310, the processed data output circuit 322, the backup response signal IF 324 and the configuration/restoration control circuit 326 so as to cause them to perform operations suitable for the diagnostics processing, when the diagnostics control signal is asserted. Adversely, the diagnostics control signal IF 328 controls the diagnostics data IF 302, the arithmetic circuit 310, the processed data output circuit 322, the backup response signal IF 324 and the configuration/restoration control circuit 326 so as to cause them to perform operations suitable for the image arithmetic processing for the image data inputted from the imaging device 10, when the received diagnostics control signal is negated. Note that, the host CPU 12 may set the parameters directly to the backup response signal IF 324 at initialization of the arithmetic processing circuit 3 etc. Further, the host CPU 12 may set what sorts of the parameters and the status data are used directly to the configuration/restoration control circuit 326, when plurality sorts of the parameters and the status data are used in the arithmetic processing circuit 3.

Note that, the diagnostics control signal is asserted at the timing that the backup of the parameters and the status data shown in "Memory Control" of FIG. 6 and FIG. 7, when their backup start during backup start term tb shown in "Memory Control" of FIG. 6, and in the same of FIG. 7. In other words, the diagnostics control signal is asserted at the timing indicated by the sign "c" between "Diagnostics Processing" and "Memory Control" shown in FIG. 6, and between those shown in FIG. 7. Further, the diagnostics control signal is negated after term needed for operations of the components that use this signal. Note that, each of the signals in the ISP 2 is negated after each of the terms needed for operations of the components that use these signals, in the same way as the diagnostics control signal, unless otherwise noted.

The arithmetic circuit 310 is optimized for the image arithmetic processing of the image data inputted at each of predetermined cycles. The arithmetic circuit 310 performs the image arithmetic processing for the processing object data inputted from the diagnostics data IF 302 at the timing shown as the image input in "Input/Output" of FIG. 6 and FIG. 7.

At first, the arithmetic circuit 310 stores the parameters into parameter memory 306 inputted through the host CPU-IF 316 and the internal bus 318 and used for the image arithmetic processing. The host CPU 12 stores status data indicating various statuses of the image arithmetic processing and used for the image arithmetic processing into the status register 308. Storages of these parameters and status data into the parameter memory 306 and the status memory 308 are performed during a term indicated with signs "d" and "e" shown between "Memory Control" and "Input/Output" of FIG. 6 and FIG. 7.

Further, the arithmetic circuit 310 performs the image arithmetic processing for the diagnostics data inputted from the diagnostics data IF 302 to obtain the processed data in accordance with the control by the diagnostics control signal IF 328 responsive to the assertion of the diagnostics control signal. This diagnostics data and the processed data corresponding to the diagnostics data are inputted to the arithmetic circuit 310 at the timing shown as "Input/Output" in FIG. 6 and FIG. 7. On the other hand, the arithmetic circuit 310 performs the image arithmetic processing for the image data to obtain the processed data in accordance with the control of the diagnostics control signal IF 328 responsive to negation of the diagnostics control signal.

Further, the arithmetic circuit 310 outputs the processed data obtained in the image arithmetic processing at timing shown as image output in "Input/Output" of FIG. 6 and FIG. 7 to the processed data output circuit 322. That is, the arithmetic circuit 310 starts and completes the image arithmetic processing for the diagnostics data from the diagnostics processing circuit 5 in accordance with the control by the diagnostics control signal IF 328 responsive to the assertion of the diagnostics control signal during the term of the diagnostics processing. The arithmetic circuit 310 outputs the processed data obtained by the image arithmetic processing to the diagnostics processing circuit 5 via the processed data output circuit 322, when this image arithmetic processing ends.

Further, the arithmetic circuit 310 asserts output completion signal outputted to the backup request circuit 320 in accordance with the control by the diagnostics control signal IF 328 responsive to the assertion of the diagnostics control signal, when the output of the processed data to the diagnostics processing circuit 5 ends. The backup request circuit 320 asserts the backup request signal to the diagnostics control circuit 4 at the timing indicated with sign "a" between "Diagnostics Processing" and "Memory Control" shown in FIG. 6 and FIG. 7, when the output completion signal from the arithmetic circuit 310 is asserted.

The backup response signal IF 324 controls the parameter memory 306 and the status register 308 responsive to assertion of the backup response signal from the diagnostics control circuit 4. That is, the backup response signal IF 324 causes the parameter memory 306 and the status register 308 to output the parameters and status data stored in them to the diagnostics control circuit 4 for backing them up, responsive to the assertion of the backup response signal.

The configuration/restoration control circuit 326 controls the parameter memory 306 and the status register 308 in accordance with the control by the diagnostics control signal IF 328 or assertion of the restoration request signal from the diagnostics control circuit 4 shown in FIG. 2 and FIG. 4. That is, the diagnostics control signal IF 328 controls to cause the parameter memory 306 and the status register 308 to store the parameters and the status data for the diagnostics processing from the diagnostics processing circuit 5 shown in FIG. 2 and FIG. 5 for setting them. Further, the configuration/restoration control circuit 326 causes the parameter memory 306 and the status register 308 to read out the parameters and the status data backed up in the diagnostics control circuit 4 shown in FIG. 2 and FIG. 4 for restoring them, responsive to assertion of the restoration request signal.

If the configuration of the arithmetic processing circuit 3 is not changed by the host CPU 12, the same image arithmetic processing is performed for the image data at each of the frames. Therefore, the same parameters must be used for the image arithmetic processing for the image data from the imaging device 10, and the status data must not be changed. On the other hand, for performing both of the image arithmetic processing and the diagnostics processing at each of the frames, the arithmetic circuit 310 must use the parameters and the status data for the image arithmetic processing and the same for the diagnostics processing alternately.

For solving such a discrepancy, both of backup of the parameters and the status data for the image arithmetic processing, and setting of the configuration and status data for the image arithmetic processing are performed by the configuration/restoration control circuit 326 before the diagnostics processing. Further, restorations of the parameters and the status data for the image arithmetic processing are performed by the configuration/restoration control circuit 326 after the diagnostics processing.

The diagnostics data IF 302 selects the diagnostics data within the image data inputted from the imaging device 10 and the diagnostics data inputted from the diagnostics processing circuit 5 in accordance with the control by the diagnostics control signal IF 328 responsive to the assertion of the diagnostics control signal. Further, the diagnostics data IF 302 selects the diagnostics data within the image data inputted from the imaging device 10 and the diagnostics data inputted from the diagnostics processing circuit 5 in accordance with the control by the diagnostics control signal IF 328 responsive to the negation of the diagnostics control signal. Note that, the image data may be also supplied to the arithmetic circuit 310 from the host CPU 12 via the internal bus 318 and the diagnostics data IF 302 etc.

The diagnostics data IF 302 outputs the diagnostics data or the image data selected as such to the arithmetic circuit 310 as the processing object data during terms for image input shown in "Input/Output" of FIG. 6 and FIG. 7. On the other hand, the diagnostics data IF 302 outputs the selected diagnostics data to arithmetic circuit 310 as the processing object data sequentially during terms for the diagnostics processing shown in "Diagnostics Processing" of FIG. 6 and FIG. 7.

The processed data output circuit 322 outputs the processed data obtained from the image data and inputted from the arithmetic circuit 310 to the image data output circuit 330 according to control by the diagnostics control signal IF 328 responsive to negation of the diagnostics control signal. On the other hand, the processed data output circuit 322 outputs the processed data to the diagnostics processing circuit 5 in accordance with the control by the diagnostics control signal IF 328 responsive to assertion of the diagnostics control signal during terms for the diagnostics processing shown in "Diagnostics Processing" of FIG. 6 and FIG. 7, soon after the processed data is obtained from the diagnostics data. The image data output circuit 330 outputs the processed data obtained from the image data and inputted from the processed data output circuit 322 to outside of the image processing device 1 shown in FIG. 1. Note that, the processed image data may also be supplied to the host CPU from the processed data output circuit 322 via the internal bus 318 and the diagnostics data IF 302 etc.

[Components of the Diagnostics Control Circuit 4]

The timing control circuit 400, within the components of the diagnostics control circuit 4 of the ISP 2, shown in FIG. 2 and FIG. 4, receives the synchronization signal V and the clock signal CLK from the imaging device 10. The timing control circuit 400 controls operation timing of the other components of the diagnostics control circuit 4 based on the received synchronization signal V and clock signal. That is, the timing control circuit 400 initializes count value of the clock signal CLK when the synchronization signal V is asserted, then counts the clock signal CLK.

Further, the timing control circuit 400 sets the term, during which the synchronization signal V is asserted then the count value of the clock signal CLK becomes a predetermined value, as the backup start term tb. The timing control circuit 400 asserts backup enable signal to the diagnostics request circuit 410 in the backup start term tb. On the other hand, the timing control circuit 400 negates the backup enable signal during term except the backup start term tb.

Note that, the diagnostics processing at each of the frames, the setting and the restorations of the parameters and the status data in their vicinity must be performed after completion of the image arithmetic processing for the image data and must be completed keeping enough time space before the boundary of the next frame. That is, the time length of the backup start term tb must be sufficiently shorter than the time length obtained by subtracting the time length td of the diagnostics processing shown in "Memory Control" of FIG. 6 and FIG. 7 and time length needed for setting, backup and restoration of data from time length tf of the frame. On the other hand, of course, the time length of the backup start term tb must be longer than time length needed for the normal image arithmetic processing for the image data, in other words, longer than the time length needed for image input and image output shown in "Input/Output" of FIG. 6 and FIG. 7, by necessity.

The restoration request circuit 402 asserts the restoration request signal to the arithmetic processing circuit 3, when diagnostics completion signal from the diagnostics processing circuit 5 is asserted. Further, the restoration request circuit 402 controls to cause the backup/restoration memory 408 to output the backup parameters and status data to the arithmetic processing circuit 3. The diagnostics request circuit 410 asserts backup signal to the backup response circuit 406, when the backup enable signal from the timing control circuit 400 and the backup request signal from the backup request signal IF 404 are asserted.

The backup request signal IF 404 receives the backup request signal from the arithmetic processing circuit 3, then output it to the backup response circuit 406 and the diagnostics request circuit 410. The restoration request circuit 402 asserts the restoration request signal to the arithmetic processing circuit 3, when the restoration request signal from the arithmetic processing circuit 3 is asserted. Further, the restoration request circuit 402 controls to cause the backup/restoration memory 408 to output the backup parameters and status data to the arithmetic processing circuit 3 for their restoration in it.

The backup response circuit 406 asserts the backup response signal to the arithmetic processing circuit 3, when the backup signal from the diagnostics request circuit 410 and the backup request signal from the backup request signal IF 404 are asserted. Further, the backup response circuit 406 controls to cause the backup/restoration memory 408 to store and to back up the parameters and the status data inputted from the arithmetic processing circuit 3 after the assertion of the backup response signal.

The backup response circuit 406 asserts diagnostics request signal to the processing circuit 5 at timing indicated by sign "b" between "Diagnostics Processing" and "Memory Control" shown in FIG. 6 and FIG. 7, after completion of backup of these data responsive to the assertion of the backup signal. Note that, the backup response circuit 406 asserts the diagnostics request signal to the diagnostics processing circuit 5, only when relationship "tf<tb+td+td" stands. Note that, tf is shown in "V/Frame" of FIG. 6, and tb, td are shown between "Diagnostics Processing" and "Memory Control" shown in FIG. 6, and tr is time length needed for data restoration shown in "Memory Control" of FIG. 6 and FIG. 7. That is, the backup response circuit 406 asserts the diagnostics request signal, when the backup enable signal is asserted and the backup is requested.

The backup/restoration memory 408 stores and backs up the parameters and the status data inputted from the arithmetic processing circuit 3 in accordance with control by the backup response circuit 406. Further, the backup/restoration memory 408 outputs the backup parameters and status data to the arithmetic processing circuit 3 according to control by the restoration request circuit 402. Note that, the backup/restoration memory 408 may be configured so that it can back up a plurality of the parameters and a plurality of the status data. If the backup/restoration memory 408 backs up a plurality of the parameters and a plurality of the status data, the backup response circuit 406 and the restoration request circuit 402 must designate storage area of the parameters and the status data to be backed up and to be restored.

[Components of the Diagnostics Processing Circuit 5]

The diagnostics data memory 504 within components of the diagnostics processing circuit 5, shown in FIG. 2 and FIG. 5, stores data needed for diagnostics so as to whether or not the image arithmetic processing by the arithmetic processing circuit 3 is performed normally. The data stored in the diagnostics data memory 504 include a plurality sorts of diagnostics data, outcome data indicating expected values each corresponding to each of the plurality sorts of diagnostics data, and the parameters and the status data each corresponding to each of the plurality sorts of diagnostics data.

Each of the outcome data corresponding to each of the plurality sorts of the diagnostics data is expected values of the normal image arithmetic processing for each of the plurality sorts of diagnostics data. That is, each of the outcome data corresponding to each of the plurality sorts of the diagnostics data is same as the processed data obtained by the normal image arithmetic processing for each of the plurality sorts of diagnostics data by the arithmetic circuit 310 using the parameters and the status data corresponding to each of the diagnostics data.

In other words, when the arithmetic circuit 310 to which one sort of parameters and one sort of status data are set performs the image arithmetic processing for the diagnostics data corresponding to the set parameters and the status data normally, the processed data that is same with the outcome data is obtained. Therefore, the identicalness of the processed data obtained by the image arithmetic processing for one sort of the diagnostics data performed by the arithmetic processing circuit 3 and the outcome data corresponding to this sort of diagnostics data confirms that the image arithmetic processing is performed normally. The other way, the non-identicalness of the processed data obtained by the image arithmetic processing for one sort of the diagnostics data performed by the arithmetic processing circuit 3 and the outcome data corresponding to this sort of diagnostics data indicate that an abnormality occurred in the image arithmetic processing.

The operation control circuit 500 initializes all the components of the diagnostics processing circuit 5 except the diagnostics data memory 504, when the synchronization signal V shown in "V/Frame" of FIG. 6 and FIG. 7, is asserted. The control signal generation circuit 502 asserts the diagnostics control signal to the arithmetic processing circuit 3 shown in FIG. 2 and FIG. 3, when the diagnostics request signal from the diagnostics control circuit 4, shown in FIG. 2 and FIG. 4, is asserted.

Further, the control signal generation circuit 502 controls to cause the diagnostics data memory 504 to output one of the plurality of sofs of diagnostics data and the parameters and the status data corresponding to this diagnostics data to the arithmetic processing circuit 3. Further, the control signal generation circuit 502 controls to cause the diagnostics data memory 504 to output the outcome data corresponding to the outputted diagnostics data to the diagnostics circuit 506.

The diagnostics circuit 506 compares the outcome data inputted from the diagnostics data memory 504 with the processed data inputted from the arithmetic processing circuit 3, and makes diagnostics that the image arithmetic processing is performed normally at the arithmetic circuit 310, when they are identical to each other. The other way, the diagnostics circuit 506 makes diagnostics that an abnormality occurs in the image arithmetic processing at the arithmetic circuit 310, when the outcome data inputted from the diagnostics data memory 504 and the processed data inputted from the arithmetic processing circuit 3 are not identical to each other.

Further, the diagnostics circuit 506 outputs the outcome data of this diagnostics to the host CPU 12 shown in FIG. 2. Further, the diagnostics circuit 506 asserts the diagnostics completion signal to the restoration request circuit 402 of the diagnostics control circuit 4. Note that, the host CPU 12 may perform exception processing appropriately, when the result of this diagnostics indicates that an abnormality occurs in the image arithmetic processing.

[Normal Operation of the Image Processing Device 1]

Figure 8:
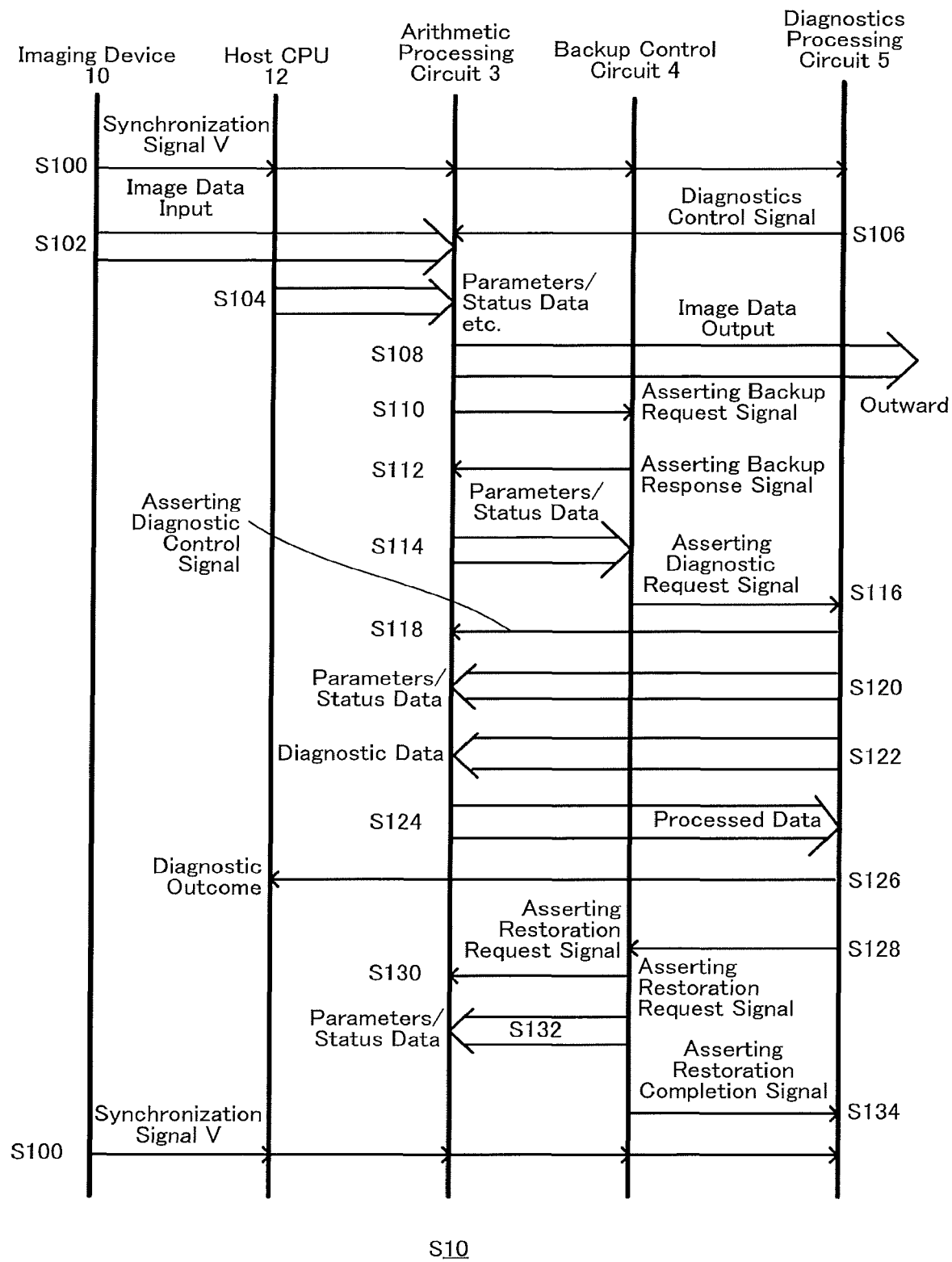
FIG. 8 is a sequence diagram indicative of a total operation (S10) when a normal arithmetic processing is performed by the arithmetic processing circuit in the image processing device shown in FIG. 1.

FIG. 8 is a sequence diagram indicative of a total operation (S10) when a normal arithmetic processing is performed by the arithmetic processing circuit 3 in the image processing device 1 shown in FIG. 1. Total operation in the image processing device 1 shown in FIG. 1 at the image arithmetic processing performed normally will be described below, referring to "V/Frame", "Arithmetic Processing Circuit", "Diagnostics Processing", "Memory Control" and "Input/Output", shown in FIG. 6, and FIG. 8. Note that, the normal operation of the image processing device 1 are performed sequentially at each of the frames, so long as the processing of the image processing device 1 itself does not end, or the image arithmetic processing for the image data are completed after the backup start term tb shown in "Memory Control" of FIG. 6.

In step S100 and step S102, the imaging device 10 shown in FIG. 1 outputs the clock signal CLK and the synchronization signal V indicating the boundaries between the frames of the image data shown in "V/Frame" of FIG. 6, the image data of the image data synchronized with the clock signal CLK to the ISP 2 at each of the frames. When a user of the image processing device 1 operates for selecting one sort of the image arithmetic processing, the host CPU 12 accepts this operation. In step S104, the host CPU 12 outputs the parameters, status data and the other data for the image arithmetic processing selected responsive to the operation to the arithmetic processing circuit 3.

The host CPU 12 shown in FIG. 3 outputs the parameters and the status data of the image arithmetic processing for the image data within the inputted data to the arithmetic circuit 310, when data is inputted in the frame N. The arithmetic circuit 310 stores the inputted parameters and status data into an internal memory (not shown in FIGS.).

The arithmetic circuit 310 stores the stored parameters and status data into the parameter memory 306 and the status register 308 before the processing object data is inputted and after the synchronization signal V is asserted in the next frame N+1. That is, arithmetic circuit 310 stores the parameters and the status data inputted at the timing between signs "d" and "e", shown in "Memory Control" of FIG. 6, into the parameter memory 306 and the status register 308.

Note that, the host CPU 12 does not output data for configuration to the ISP 2, the storage of the parameters nor the status data into the parameter memory 306 or the status register 308 of the arithmetic processing circuit 3 are not performed obviously, when setting operation by the user of the image processing device 1 is not performed.

[Image Arithmetic Processing for the Image Data]

The host CPU 12 of the ISP 2 may set the parameters, the status data and the other data for the image arithmetic processing into the parameter memory 306 and the status register 308 of the arithmetic processing circuit 3 within previous frame for actual processing. In such a case, the host CPU 12 stores these data into the parameter memory 306 and the status register 308 in the term shown with signs "d" and "e" in "Memory Control" and "Input/Output" of FIG. 6.

The imaging device IF 300 accepts the clock signal CLK and the synchronization signal V from the imaging device 10 to output them to the diagnostics data IF 302. Further, the imaging device IF 300 accepts the image data to output the accepted image data to the diagnostics data IF 302.

The timing control circuit 400 of the diagnostics control circuit 4, shown in FIG. 2 and FIG. 4, initializes the count value of the clock signal CLK responsive to assertion of the synchronization signal V shown in "V/Frame" of FIG. 6, then counts the clock signal CLK. Further, the timing control circuit 400 sets the term from the assertion of the synchronization signal V until the count value of the clock signal CLK becomes the predetermined value as the backup start term tb, and asserts the backup enable signal to the diagnostics request circuit 410.

In step S106, the diagnostics control signal outputted from the control signal generation circuit 502 of the diagnostics processing circuit 5 shown in FIG. 5 is initialized to be negated responsive to the assertion of the synchronization signal V at the starting time of image data input to the of the arithmetic circuit 310 shown in "Input/Output" of FIG. 6. Therefore, the diagnostics control signal IF 328 that accepts the negated diagnostics control signal controls the components of the arithmetic processing circuit 3 so that they perform suitable operation of the image arithmetic processing for the image data inputted from the imaging device 10.

That is, the diagnostics data IF 302 selects the image data inputted from the imaging device 10 to output the accepted image data to the arithmetic circuit 310 as the processing object data. The arithmetic circuit 310 performs the image processing for the image data by using the parameters and the status data stored in the parameter memory 306 and the status register 308.

Further, the arithmetic circuit 310 stores the status data indicating statuses of the arithmetic circuit 310 itself and the image arithmetic processing into the status register 308 sequentially according to progression of the image arithmetic processing for the image data. Note that, the status data stored in the status register 308 are used in the data image arithmetic processing at the arithmetic circuit 310 appropriately.

The arithmetic circuit 310 outputs the processed data obtained by the image arithmetic processing to the processed data output circuit 322 at timing of the image output shown in "Input/Output" of FIG. 6. In step S108, the image data output circuit 330 outputs the processed data as the image data to the outside of the image processing device 1. Note that, although input and output for the image data of the arithmetic processing circuit 3 in step S102 and step S108 can overlap as shown in "Input/Output" of FIG. 6, they do not overlap in the signal sequence diagram because of interest for diagrammatic representation. Further, the arithmetic circuit 310 asserts the output completion signal to the backup request circuit 320 after completions of image data output of one frame, the image arithmetic processing and its outcome data output.

[Image Arithmetic Processing for the Diagnostics Data]

In step S110, the backup request circuit 320 asserts the backup request signal to the backup request signal IF 404 of the diagnostics control circuit 4 shown in FIG. 2 and FIG. 4. The backup request signal IF 404 outputs the backup request signal from the backup request circuit 320 to the backup response circuit 406 and the diagnostics request circuit 410.

In step S112, the backup response circuit 406 asserts the backup response signal, when the backup request signal from the backup request signal IF 404 is asserted, while the backup enable signal from the timing control circuit 400 is asserted. That is, the backup response circuit 406 asserts the backup response signal at timing indicated with sign "c" shown between "Memory Control" and "Input/Output" of FIG. 6, after the setting term ts, shown in "Input/Output" of FIG. 6, and after the image input and the image output shown in "Input/Output" of FIG. 6.

In step S114, the backup response signal IF 324 controls the parameter memory 306 and the status register 308 responsive to the assertion of the backup response signal. The parameter memory 306 and the status register 308 output the stored parameters and status data to the backup/restoration memory 408 of the diagnostics control circuit 4 at timing of the backup shown in "Memory Control" of FIG. 6.

On the other hand, the backup response circuit 406 controls to cause the backup/restoration memory 408 to store the parameters and the status data inputted from arithmetic processing circuit 3 into the parameter memory 306 and the status register 308, and backs up them. Further, in step S116, the backup response circuit 406 asserts the diagnostics request signal to the control signal generation circuit 502 of the diagnostics processing circuit 5 at timing indicated with sign "b" shown between "Diagnostics Processing" and "Memory Control" shown in FIG. 6.

In step S118, the control signal generation circuit 502 of the diagnostics processing circuit 5 asserts the diagnostics control signal to the diagnostics control signal IF 328 of the arithmetic processing circuit 3 responsive to the assertion of the diagnostics request signal. The diagnostics control signal IF 328 controls the components of the arithmetic processing circuit 3 so as to perform the operations suitable for the image arithmetic processing for the diagnostics data from the diagnostics processing circuit 5 responsive to assertion of the diagnostics control signal.

In step S120, the control signal generation circuit 502 controls to cause the diagnostics data memory 504 to output one of the plurality sorts of the parameters and one of the plurality sorts of status data to the parameter memory 306 and the status register 308 according to a predetermined rule. The parameter memory 306 and the status register 308 store the parameters and the status data from the diagnostics data memory 504 at timing shown in "Memory Control" of FIG. 6. Further, the control signal generation circuit 502 controls to cause the diagnostics data memory 504 to output the outcome data corresponding to the outputted parameters etc. to the diagnostics circuit 506.

In step S122, the control signal generation circuit 502 controls to cause the diagnostics data memory 504 to output the diagnostics data corresponding to the parameters etc. outputted in step S120 to the diagnostics data IF 302. The diagnostics data IF 302 outputs the diagnostics data inputted from the diagnostics data memory 504 as the processing object data to the arithmetic circuit 310 in term shown in "Input/Output" of FIG. 6.

The diagnostics control signal IF 328 of the arithmetic processing circuit 3 controls the arithmetic circuit 310 and the configuration/restoration control circuit 326. The configuration/restoration control circuit 326 controls the parameter memory 306 and the status register 308 responsive to the control by the diagnostics control signal IF 328. The parameter memory 306 and the status register 308 store the parameters and the status data for the diagnostics processing inputted from the diagnostics data memory 504 of the diagnostics processing circuit 5 responsive to the control by the configuration/restoration control circuit 326.

The arithmetic circuit 310 performs the image arithmetic processing for the processing object data by using the parameters and the status data for the diagnostics processing stored in the parameter memory 306 and the status register 308 according to the control by the diagnostics control signal IF 328. This image arithmetic processing for the processing object data starts soon after completion of the input of the processing object data. In step S124, the arithmetic circuit 310 sequentially outputs the processed data obtained by this image arithmetic processing to the diagnostics processing circuit 5 in the term shown in "Input/Output" of FIG. 6.

The diagnostics circuit 506 of the diagnostics processing circuit 5 compares the processed data inputted from the arithmetic processing circuit 3 with the outcome data corresponding to the diagnostics data inputted from the diagnostics data memory 504. The diagnostics circuit 506 makes diagnostics that the image arithmetic processing is performed normally in the arithmetic circuit 310, when the processed data inputted from the arithmetic processing circuit 3 and the outcome data corresponding to this diagnostics data are identical to each other.

On the other hand, the diagnostics circuit 506 makes diagnostics that an abnormality occurs in the image arithmetic processing in the arithmetic circuit 310, when the processed data inputted from the arithmetic processing circuit 3 and the outcome data corresponding to this diagnostics data are not identical to each other. In step S126, the diagnostics circuit 506 outputs this result of the diagnostics to the host CPU 12. Further, in step S128, the diagnostics circuit 506 asserts the diagnostics completion signal to the restoration request circuit 402 of the diagnostics control circuit 4.

In step S130, the restoration request circuit 402 asserts the restoration request signal to the configuration/restoration control circuit 326 of the arithmetic processing circuit 3 responsive to the assertion of the diagnostics completion signal. Further, in step S132, the restoration request circuit 402 controls to cause the backup/restoration memory 408 to output the backup parameters and status data to the arithmetic processing circuit 3 and to restore them responsive to assertion of the diagnostics completion signal. In step S134, the diagnostics processing circuit 5 informs the diagnostics control circuit 4 of the completion of the restoration, when restorations of the backup parameters and the status data are completed.

The configuration/restoration control circuit 326 of the arithmetic processing circuit 3 controls the parameter memory 306 and the status register 308 responsive to the assertion of the restoration request signal. The parameter memory 306 and the status register 308 read the backup parameters and status data from the diagnostics control circuit 4 and restore them.

[Abnormal Operation of the Image Processing Device]

Figure 9:
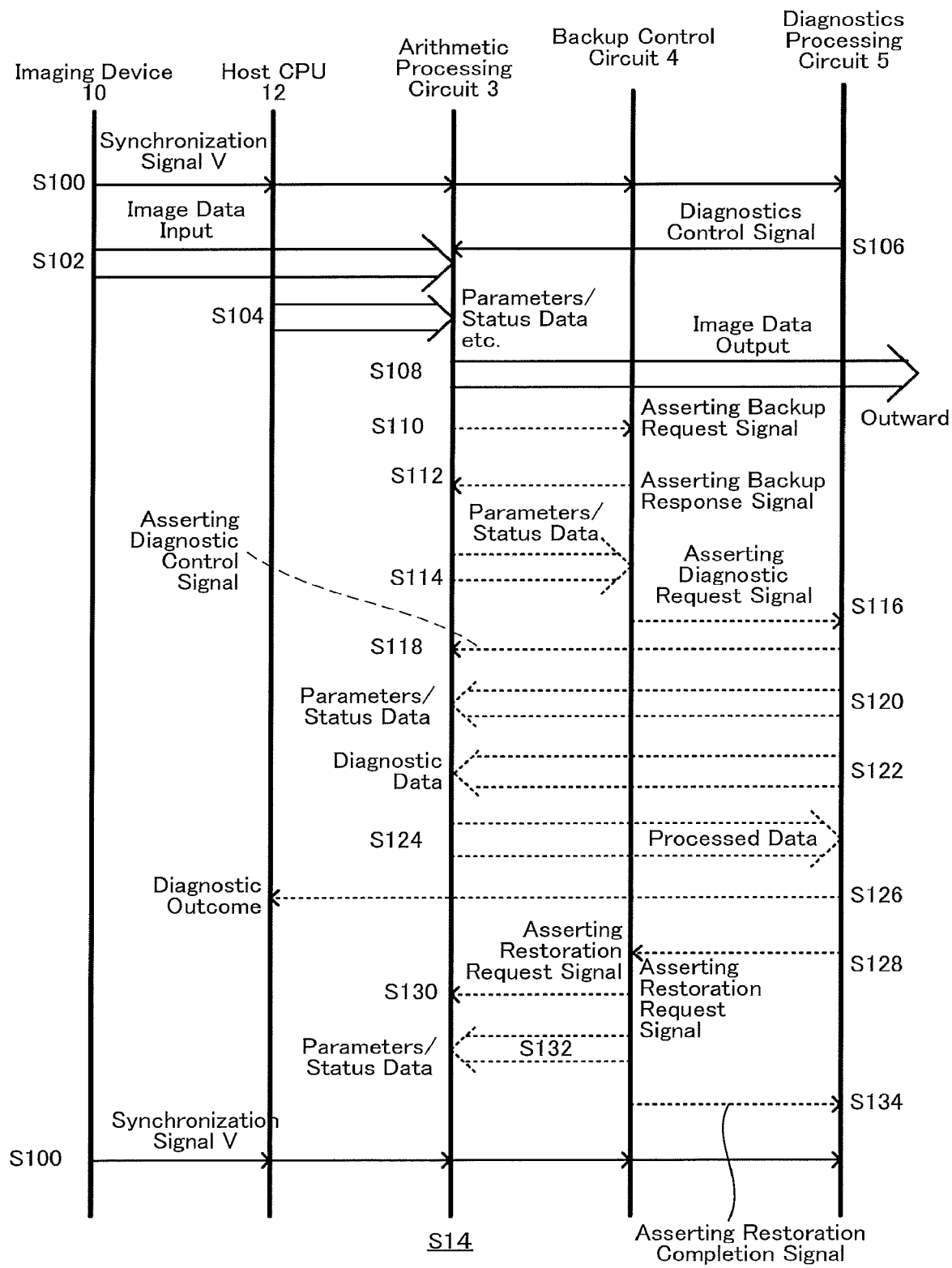
FIG. 9 is a sequence diagram indicative of a total operation (S14) when an abnormal arithmetic processing is performed by the arithmetic processing circuit in the image processing device shown in FIG. 1.

FIG. 9 is a sequence diagram indicative of a total operation (S14) when an abnormal arithmetic processing is performed by the arithmetic processing circuit 3 in the image processing device 1 shown in FIG. 1. Total operation of the image processing device 1 shown in FIG. 1, in which the image arithmetic processing delays, and the image arithmetic processing and the diagnostics processing are not performed within one frame, in other words, an abnormal operation of the image arithmetic processing will be described below, referring to "V/Frame", "Arithmetic Processing Circuit", "Diagnostics Processing", "Memory Control" and "Input/Output" shown in FIG. 7 and FIG. 9. In the description of the abnormal operation of the image processing device 1, the differences between the normal operation and the abnormal operation of the image processing device 1 will be mainly remarked.

The backup request circuit 320 of the arithmetic processing circuit 3 shown in FIG. 2 and FIG. 3 asserts the backup request signal to the backup request signal IF 404 of the diagnostics control circuit 4, shown in FIG. 2 and FIG. 4, responsive to assertion of the output completion signal of the arithmetic circuit 310. However, the backup request signal asserts after the backup enable term tb shown with sign "d" between "Diagnostics Processing", "Memory Control" in the frame N shown in FIG. 7. Such an event may occur, when very many configurations are set, or very many data are inputted from the host CPU 12 to the ISP 2 shown in FIG. 1, while the arithmetic processing circuit 3 performs the image arithmetic processing by using the processing memory 314 very frequently.

The backup response circuit 406 does not assert the backup response signal, because the backup request signal asserts after the completion of the backup start term tb within the frame N, shown with sign "c" between "Memory Control" and "Input/Output" shown in FIG. 7. Further, the backup response circuit 406 does not perform control for the parameter memory 306 nor the status register 308. Further, the diagnostics processing circuit 5 does not perform the diagnostics processing, because the backup response circuit 406 does not assert the diagnostics request signal. Therefore, only the image arithmetic processing for the image data is performed in the image processing device 1. That is, in this case, operations of S110-S134 are not performed as shown with dotted lines in FIG. 9, but only the operations of S 100-S108 are performed.

On the other hand, as shown with dotted lines between "Diagnostics Processing" and "Memory Control" of FIG. 7, the image processing device 1 does not perform the backup, the restoration of the parameters, the status data, nor the diagnostics processing. Note that, the abnormal operation of the image processing device 1 returns to the normal operation described below, referring to "V/Frame", "Arithmetic Processing Circuit", "Diagnostics Processing", "Memory Control" and "Input/Output", shown in FIG. 6, and FIG. 8, when the delay of the image arithmetic processing is resolved, and both of the image arithmetic processing and the diagnostics processing can be performed within one frame.

Second Embodiment

Figure 10:
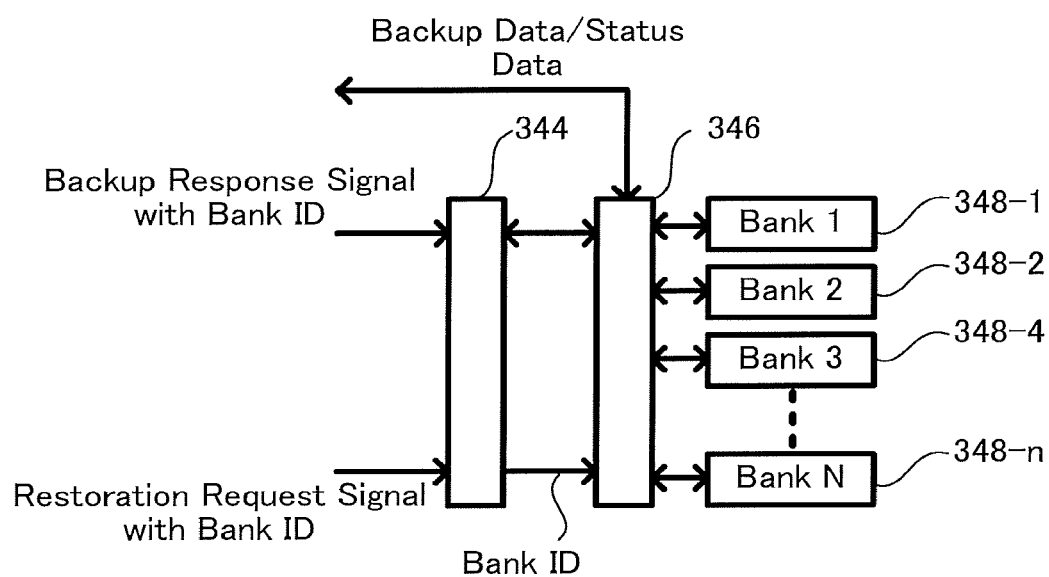
FIG. 10 is a configuration diagram of a second parameter memory and a second status memory replacing the first parameter memory and the first status memory in the arithmetic processing circuit shown in FIG. 3.

The second embodiment will be described in detail below. FIG. 10 is a configurations diagram of a second parameter memory 340 and a second status memory 342 replacing the first parameter memory 306 and the first status memory 308 in the arithmetic processing circuit 3 shown in FIG. 3. As shown in FIG. 10, each of storage circuits of the parameter memory 340 and the status memory 342 is divided into banks 348-1-348-n (bank 1-n) so that a plurality (n; n is integer larger than or equal to 2) sorts of the parameters and the status data can be stored.

Therefore, the diagnostics control circuit 4, shown in FIG. 4, must use the backup response signal and the restoration request signal including information designating one of the banks (bank ID). A control circuit 344 controls to cause a selector 346 to select one of the banks 1-n of the respective parameter memory 340 and the status memory 342, to input and to output the parameters and the status data, when accepting backup response signal and the restoration request signal including the bank ID. By using the parameter memory 340 and the status memory 342 configured as described above and modifying the operation of the diagnostics control circuit 4, backup and restoration of the plurality sorts of the parameters and the status data can be implemented.

[Modifications]

Note that, the image processing device 1, in which the image arithmetic processing for the image data generated by imaging device 10 is performed by ISP 2, is described above. On the other hand, it is possible to cause the image processing device 1 to perform arithmetic processing for various data inputted periodically other than the image data of the moving image by appropriate modification. The image processing device 1 modified appropriately can perform arithmetic processing for voice data, data to be displayed on a display device and data for computer games etc.

Further, the order of the sending and receiving the signals, shown in FIG. 8 and FIG. 9, can be permuted, if the permuted order does not contradict nor interfere with the operations of the image processing device 1. The components of the image processing device 1 can be modified appropriately, if the permuted order does not contradict nor interfere with the operation of the image processing device 1. For example, the arithmetic processing circuit 3 may not comprise the statistics information processing circuit 332.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An arithmetic processing device, comprising:
    an arithmetic processing circuit configured to perform arithmetic processing for image data at each of frames synchronized with a synchronization signal of a moving image inputted at each of predetermined cycles synchronized with a clock signal to obtain a result of the arithmetic processing for the image data, and to output the result of the arithmetic processing for the image data;
    a diagnostics processing circuit configured to perform diagnostics processing for inputting diagnostics data into the arithmetic processing circuit instead of the image data, and for causing the arithmetic processing circuit to perform the arithmetic processing for the diagnostics data input into the arithmetic processing circuit for making diagnostics as to whether or not an error occurs in the arithmetic processing based on the result of the arithmetic processing for the diagnostics data;
    a backup request circuit configured to assert a backup request signal at each of the frames when the arithmetic processing circuit completes outputting the result of the arithmetic processing for the image data;
    a timing control circuit configured to count the clock signal to assert a backup enable signal at each of the frames during the synchronization signal being asserted then a count value of the clock signal becomes a predetermined value;
    a first determination processing circuit configured to perform first determination processing for determining that the diagnostics processing is performed when both of the backup request signal and the backup enable signal are asserted; and
    a diagnostics control circuit configured to perform diagnostics control for causing the diagnostics processing circuit to perform the diagnostics processing when it is determined that the diagnostics processing is performed.

2. The arithmetic processing device according to claim 1, wherein
    the diagnostics processing circuit further comprises:
    a second determination processing circuit configured to perform a second determination processing for determining whether or not an error occurs in the arithmetic processing based on outcome data indicating a normal result of the arithmetic processing for the diagnostics data and the result of the arithmetic processing for the diagnostics data.

3. The arithmetic processing device according to claim 2, wherein
    the second determination processing circuit makes diagnostics that an error occurs in the arithmetic processing when the outcome data and the processed data are not identical to each other.

4. The arithmetic processing device according to claim 3, wherein the arithmetic processing circuit stores setting data used for the arithmetic processing for the image data before the arithmetic processing for the image data starts, and wherein the diagnostics control circuit further comprises:

a backup processing circuit configured to perform backup processing to backup the setting data used for the arithmetic processing for the image data as backup setting data before the diagnostics processing is performed; and a restoration processing circuit configured to perform restoration processing to restore the backup setting data to the arithmetic processing circuit after the diagnostics processing is performed.

5. The arithmetic processing device according to claim 4, wherein the diagnostics processing circuit further comprises:

a setting processing circuit configured for performing setting processing to set the setting data for the diagnostics processing to the arithmetic processing circuit before the diagnostics processing starts.

6. The arithmetic processing device according to claim 4, wherein the diagnostics processing circuit further comprising:

a diagnostic data memory configured to store plurality of diagnostics data, plurality of setting data each used for the arithmetic processing for one of the plurality of diagnostics data, and plurality of outcome data each indicating the normal result of the arithmetic processing for one of the plurality of diagnostics data, and wherein a control signal generation circuit configured to cause the diagnostic data memory to output one of the plurality of diagnostics data and the setting data used for the arithmetic processing for the diagnostics data outputted to the arithmetic processing circuit to the arithmetic processing circuit, and to output the outcome data indicating the normal result of the arithmetic processing for the diagnostics data outputted to the arithmetic processing circuit to the second determination processing circuit.

7. The arithmetic processing device according to claim 4, wherein the setting data for the diagnostics processing includes at least parameters and status data used for making the diagnostics.

8. The arithmetic processing device according to claim 1, further comprising:

a data generation device for generating the image data synchronized with the clock signal sequentially at each of the frames.

9. The arithmetic processing device according to claim 8, wherein the data generation device is an imaging device configured to generate the image data in the moving image by capturing an imaging target.

10. The arithmetic processing device according to claim 1, wherein the diagnostics processing circuit does not cause the arithmetic processing circuit to perform arithmetic processing for diagnostics data when it is not determined that the diagnostics processing is performed.

11. An arithmetic processing method for an arithmetic processing circuit configured to perform arithmetic processing for image data at each of frames synchronized with a synchronization signal of a moving image inputted at each of predetermined cycles synchronized with a clock signal to obtain a result of the arithmetic processing for the image data, and to output the result of the arithmetic processing for the image data, the arithmetic processing method, comprising:

inputting diagnostics data into the arithmetic processing circuit instead of the image data;

causing the arithmetic processing circuit to perform arithmetic processing for the diagnostics data input into the arithmetic processing circuit;

making diagnostics as to whether or not an error occurs in the arithmetic processing based on the result of the arithmetic processing for the diagnostics data;

performing first assertion processing to assert a backup request signal at each of the frames when the arithmetic processing circuit completes outputting the result of the arithmetic processing for the image data;

performing second assertion processing to count the clock signal to assert a backup enable signal at each of the frames during the synchronization signal being asserted then a count value of the clock signal becomes a predetermined value;

performing determination processing to determine that the diagnostics processing is performed when both of the backup request signal and the backup enable signal are asserted;

performing the arithmetic processing for the diagnostics data when it is determined that the diagnostics processing is performed; and performing diagnostics control for causing to perform the diagnostics processing when it is determined that the diagnostics processing is performed.

* * * * *

UNITED STATES PATENT AND TRADEMARK OFFICE
CERTIFICATE OF CORRECTION

| | |
|---|---|
| PATENT NO. | : 10,884,836 B2 |
| APPLICATION NO. | : 15/901493 |
| DATED | : January 5, 2021 |
| INVENTOR(S) | : Yutaka Yamada |

Page 1 of 1

It is certified that error appears in the above-identified patent and that said Letters Patent is hereby corrected as shown below:

On the Title Page

In Column 1, item (54), and In the Specification delete "ARITHMETIC PROCESSING DEVICE AND METHOD THEREFOR" and insert --ARITHMETIC PROCESSING DEVICE PERFORMING REAL TIME DIAGNOSTICS PROCESSING AND METHOD THEREFOR--.

Signed and Sealed this
Fourth Day of May, 2021

Drew Hirshfeld
*Performing the Functions and Duties of the
Under Secretary of Commerce for Intellectual Property and
Director of the United States Patent and Trademark Office*